(12) United States Patent
Ueta et al.

(10) Patent No.: US 11,741,894 B2
(45) Date of Patent: Aug. 29, 2023

(54) LIGHT-EMITTING DEVICE AND METHOD FOR CONTROLLING LIGHT-EMITTING DEVICE

(71) Applicant: SHARP KABUSHIKI KAISHA, Osaka (JP)

(72) Inventors: Yoshihiro Ueta, Osaka (JP); Hisayuki Utsumi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/911,606

(22) PCT Filed: Mar. 25, 2020

(86) PCT No.: PCT/JP2020/013179
§ 371 (c)(1),
(2) Date: Sep. 14, 2022

(87) PCT Pub. No.: WO2021/192068
PCT Pub. Date: Sep. 30, 2021

(65) Prior Publication Data
US 2023/0125015 A1    Apr. 20, 2023

(51) Int. Cl.
*G09G 3/3225* (2016.01)
*H10K 50/115* (2023.01)
(Continued)

(52) U.S. Cl.
CPC ......... *G09G 3/3225* (2013.01); *H10K 50/115* (2023.02); *H10K 50/818* (2023.02);
(Continued)

(58) Field of Classification Search
CPC ......... G09G 3/3225; G09G 2300/0426; G09G 2320/02; G09G 2330/00; H10K 50/115;
(Continued)

(56) References Cited

U.S. PATENT DOCUMENTS

2002/0155319 A1   10/2002  Kawamura et al.
2006/0006792 A1*   1/2006  Strip ............... H10K 59/128
                                                313/506
(Continued)

FOREIGN PATENT DOCUMENTS

JP        2000-235893 A       8/2020

*Primary Examiner* — David Tung
(74) *Attorney, Agent, or Firm* — ScienBiziP, P.C.

(57) ABSTRACT

A light-emitting device includes a first electrode, a second electrode facing the first electrode, a light-emitting layer provided between the first electrode the second electrode and including a phosphor, a layered body including a metal layer, a first insulating layer provided on a second electrode side of the metal layer, and a second insulating layer provided on a light-emitting layer side of the metal layer, and having a thickness that allows electron injection from the second electrode to the light-emitting layer, a first power supply configured to apply a voltage between the first electrode and the second electrode, and a second power supply configured to apply, between the metal layer and the second electrode, a voltage of which polarity of the second polarity is opposite to a polarity of the second electrode of a voltage applied by the first power supply between the first electrode and the second electrode.

17 Claims, 8 Drawing Sheets

(51) Int. Cl.
*H10K 50/818* (2023.01)
*H10K 102/00* (2023.01)

(52) U.S. Cl.
CPC . *G09G 2300/0426* (2013.01); *G09G 2320/02* (2013.01); *G09G 2330/00* (2013.01); *H10K 2102/3026* (2023.02); *H10K 2102/351* (2023.02)

(58) Field of Classification Search
CPC ......... H10K 50/818; H10K 2102/3026; H10K 2102/351
See application file for complete search history.

(56) References Cited

U.S. PATENT DOCUMENTS

| | | | |
|---|---|---|---|
| 2008/0136321 A1* | 6/2008 | Do | H10K 50/17 313/504 |
| 2020/0075897 A1* | 3/2020 | Tanaka | H10K 71/00 |
| 2020/0274108 A1* | 8/2020 | Tanaka | H10K 59/123 |

* cited by examiner

LIGHT-EMITTING DEVICE AND METHOD FOR CONTROLLING LIGHT-EMITTING DEVICE

TECHNICAL FIELD

The disclosure relates to a light-emitting device and a method for controlling a light-emitting device.

SUMMARY

Background Art

For example, PTL 1 discloses an organic electroluminescence element in which a cathode, an organic light-emitting layer, an inorganic thin film layer, and an anode are layered.

CITATION LIST

Patent Literature

PTL 1: JP 2000-235893 A

SUMMARY OF INVENTION

Technical Problem

In order to drive the organic electroluminescence element (light-emitting portion) described in Cited Document 1, for example, a switching element such as a thin film transistor (TFT) is used. That is, it can be said that a combination of the light-emitting portion and the TFT functions as one light-emitting device. Further, as a method for connecting the TFT and the light-emitting portion, for example, it is conceivable to layer and connect them. However, depending on the combination of the type of TFT, the configuration of the light-emitting portion, the layering order of the TFT and the light-emitting portion, and the like, a good luminous efficiency of the light-emitting device may not be achieved. In view of this, one aspect of the disclosure is directed to providing a light-emitting device that achieves a good luminous efficiency.

Solution to Problem

A light-emitting device according to one aspect of the disclosure includes a first electrode, a second electrode facing the first electrode, a light-emitting layer provided between the first electrode the second electrode and including a phosphor, a layered body including a metal layer, a first insulating layer provided on a second electrode side of the metal layer, and a second insulating layer provided on a light-emitting layer side of the metal layer and having a thickness allowing electron injection from the second electrode to the light-emitting layer, a first power supply that applies a voltage between the first electrode and the second electrode; and a second power supply that applies, between the metal layer and the second electrode, a voltage having a polarity, of the second electrode, being opposite to a polarity of the voltage applied by the first power supply.

Advantageous Effects of Disclosure

The one aspect of the disclosure can provide a light-emitting device that achieves a good luminous efficiency.

DESCRIPTION OF EMBODIMENTS

First Embodiment

Figure 1:
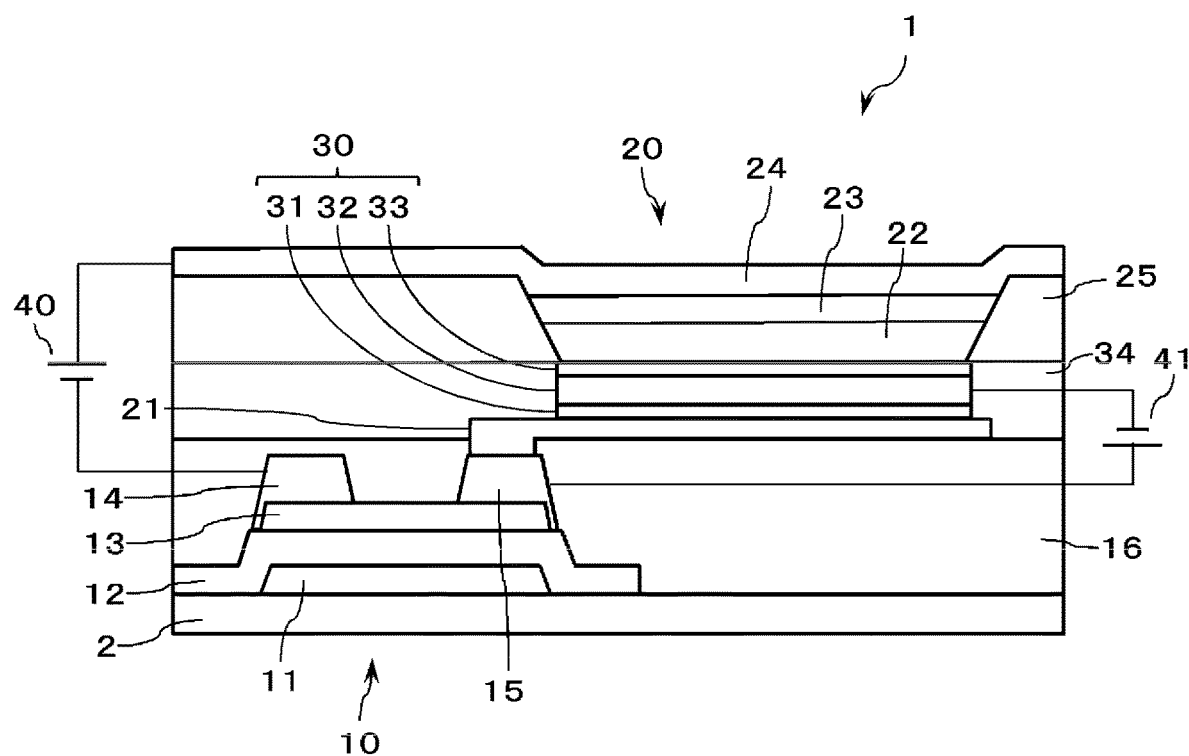
FIG. 1 is a cross-sectional view schematically illustrating an example of a layered structure of a light-emitting device according to a first embodiment.

Hereinafter, an embodiment of the disclosure will be described. FIG. 1 is a cross-sectional view schematically illustrating an example of a layered structure of a light-emitting device 1 according to the present embodiment.

As illustrated in FIG. 1, the light-emitting device 1 includes, for example, a thin film transistor (TFT) 10 provided on a substrate 2 and a light-emitting portion 20. The light-emitting portion 20 is controlled by the TFT 10, which is a switching element, and emits light. Although one pixel is illustrated in FIG. 1, for example, a plurality of the pixels are arranged and formed, so that a display device can be made.

The TFT 10 includes a gate electrode 11, a gate insulating layer 12, a channel layer 13, a source electrode 14, and a drain electrode 15, for example.

The gate electrode 11 is formed on the substrate 2. An insulating layer may be provided between the substrate 2 and the gate electrode 11. The gate electrode 11 is formed of a metal material such as copper or titanium, for example.

The gate insulating layer 12 is formed on the gate electrode 11. The gate insulating layer 12 insulates the gate electrode 11. The gate insulating layer 12 is formed of a transparent insulating material such as silicon nitride or silicon oxide, for example.

The channel layer 13 is formed on the gate electrode 11 and the gate insulating layer 12. The TFT 10 in the present embodiment is, for example, an n-channel type TFT. The channel layer 13 is made of an n-type semiconductor (hereinafter, the n-type semiconductor in the channel layer 13 may be referred to as a second n-type semiconductor). Examples of a material that may serve as this n-type semiconductor include indium gallium zinc oxide (IGZO), indium zinc oxide (IZO), gallium-added zinc oxide (GZO), aluminum-added zinc oxide (AZO), ZnO, $In_2O_3$, $Ga_2O_3$, and the like. Further, in the channel layer 13, a portion connected to the source electrode 14 and a portion connected to the drain electrode 15 each are, for example, doped with an impurity to be a p-type semiconductor. Although the case where the TFT 10 is the n-channel TFT is described above, the TFT 10 is not limited to the n-channel TFT and may be, for example, a p-channel TFT or the like.

The source electrode 14 and the drain electrode 15 are formed on the channel layer 13, and are connected to the channel layer 13. The source electrode 14 and the drain electrode 15 are formed of a metal material such as copper or titanium, for example.

A flattening layer 16 is layered on the TFT 10, for example. The flattening layer 16 isolates the channel layer 13, the source electrode 14, and the drain electrode 15, for example. An insulating material such as an acrylic resin, a polyimide resin, or the like is used for the flattening layer 16, for example.

The light-emitting portion 20 is formed on the flattening layer 16. The light-emitting portion 20 and the TFT 10 are electrically connected to each other.

As illustrated in FIG. 1, the light-emitting portion 20 in the present embodiment includes, for example, a light-emitting layer 22 sandwiched between a cathode 21 serving as a second electrode and an anode 24 serving as a first electrode. In addition, a hole transport layer 23 is provided between the anode 24 and the light-emitting layer 22. In addition, the functional layered body 30 is provided between the cathode 21 and the light-emitting layer 22.

The anode 24 supplies positive holes to the light-emitting layer 22. Further, the anode 24 is provided so as to face the cathode 21. The anode 24 is made of, for example, a conductive material having conductivity. The anode 24 is preferably transparent. Specific examples of the transparent conductive material include indium tin oxide (ITO), indium zinc oxide (IZO), tin oxide ($SnO_2$), fluorine-doped tin oxide (FTO), and the like.

The anode 24 is electrically connected to the source electrode 14, for example. Thus, the anode 24 is electrically connected to the cathode 21 via the TFT 10 which is the switching element. Furthermore, for example, a first power supply 40 is provided between the anode 24 and the source electrode 14. The first power supply 40 applies, between the anode 24 and the cathode 21, a voltage for allowing the cathode 21 to be negative.

The cathode 21 supplies electrons to the light-emitting layer 22. The cathode 21 in the present embodiment is made of, for example, the n-type semiconductor. Examples of a material that may serve as this n-type semiconductor include an oxide semiconductor such as indium gallium zinc oxide (IGZO), indium zinc oxide (IZO), gallium-added zinc oxide (GZO), aluminum-added zinc oxide (AZO), ZnO, $In_2O_3$, and $Ga_2O_3$.

The cathode 21 is electrically connected to the drain electrode 15. The cathode 21 and the drain electrode 15 are preferably directly connected to each other. The cathode 21 in the present embodiment is formed of an n-type semiconductor, and thus functions as a so-called electron injection layer that facilitates injection of electrons into the light-emitting layer 22, and an electron transport layer that transports electrons to the light-emitting layer 22. This eliminates the need to provide the electron injection layer, the electron transport layer, and the like in addition to the cathode 21, a bonding interface between the cathode 21 and the electron injection layer or the like that may become a barrier of electron injection is reduced, and the drive voltage of the light-emitting device 1 is lowered, so that it is possible to achieve a good luminous efficiency. Furthermore, the cathode 21 can be formed using the same equipment as the channel layer 13 in the TFT 10, and the manufacturing process can be simplified, so that it is possible to reduce the manufacturing cost.

Note that the case where the cathode 21 is made of the n-type semiconductor is described above, but the cathode 21 may be made of, for example, a conductive material having conductivity. Examples of such a conductive material include indium tin oxide (ITO), indium zinc oxide (IZO), tin oxide ($SnO_2$), fluorine-doped tin oxide (FTO), and the like. In a case where the cathode 21 is formed of the conductive material, for example, an electron injection layer, an electron transport layer, or the like may be provided closer to the light-emitting layer 22 side of the cathode 21.

The light-emitting layer 22 emits light by positive holes supplied from the anode 24 and electrons supplied from the cathode 21. That is, the light-emitting layer 22 is provided between the cathode 21 and the anode 24. The light-emitting layer 22 includes a phosphor, for example. Examples of the phosphor, include organic light-emitting materials and quantum dots, which are semiconductor nanoparticles.

The hole transport layer 23 transports positive holes from the anode 24 to the light-emitting layer 22. The hole transport layer 23 is preferably transparent. Specific examples of a material used for the hole transport layer 23 include NiO, $Cr_2O_3$, MgO, $LaNiO_3$, $MoO_3$, $WO_3$, and the like. The hole transport layer 23 may also serve as a hole injection layer that facilitates injection of positive holes from the anode 24 to the light-emitting layer 22.

Note that the light-emitting layer 22 and the hole transport layer 23 in the present embodiment are formed in a predetermined pattern, for example, separated into island shapes at a bank 25. For the bank 25, for example, an insulating material such as an acrylic resin or a polyimide resin is used. On the other hand, the anode 24 is, for example, a common electrode formed on the entire surface.

The functional layered body 30 is a layered body in which a first insulating layer 31, a metal layer 32, and a second insulating layer 33 are layered from the cathode 21 side. The functional layered body 30 is a layered body having a thickness that allows an electron (charge) injection from the cathode 21 to the light-emitting layer 22, for example, and promotes supply of the electrons from the cathode 21 to the light-emitting layer 22. The thickness of the functional layered body 30 is preferably from 3 nm to 20 nm. Note that the thickness of the first insulating layer 31, the metal layer 32, and the second insulating layer 33 can be measured by, for example, a scanning electron microscope (SEM) and/or an optical microscope.

The first insulating layer 31 insulates the metal layer 32 and the cathode 21 from each other. The first insulating layer 31 is formed of, for example, an organic material such as a polyimide resin or an acrylic resin, SiN, $SiO_2$, SiON, SiC, AlN, AlON, and $Al_2O_3$. The thickness of the first insulating layer 31 is preferably from 1 nm to 5 nm, and more preferably from 3 nm to 5 nm.

The second insulating layer 33 insulates the metal layer 32 and the light-emitting layer 22 from each other. The second insulating layer 33 is in direct contact with the light-emitting, layer 22, for example. The thickness of the second insulating layer 33 is preferably 5 nm or less. The second insulating layer 33 is formed of, for example, the organic material such as the polyimide resin or the acrylic resin, SiN, $SiO_2$, SiON, SiC, AlN, AlON, and $Al_2O_3$. The thickness of the second insulating layer 33 is preferably from 1 nm to 5 nm, and more preferably from 3 nm to 5 nm.

Additionally, the functional layered body 30 in the present embodiment is formed in a predetermined pattern, for example, separated into island shapes in an insulating layer 34. For example, an insulating material such as the acrylic resin or the polyimide resin is used for the first insulating layer 31, the second insulating layer 33, and the insulating layer 34.

The metal layer 32 is formed of a metal material such as aluminum (Al), magnesium (Mg), silver (Ag), copper (Cu), gold (Au), platinum (Pl), nickel (Ni), molybdenum (Mo), and chromium (Cr). Further, the metal layer 32 is electrically connected to the drain electrode 15, for example. As a result, the metal layer 32 is electrically connected to the cathode 21 via the drain electrode 15. Further, a second power supply 41 is provided between the metal layer 32 and the cathode 21. The second power supply 41 applies, between the metal layer 32 and the cathode 21, a voltage for allowing the cathode 21 to be positive. That is, a polarity of the cathode 21 when a voltage is applied between the metal layer 32 and the cathode 21 by the second power supply 41 is a polarity opposite to the polarity of the cathode 21 when a voltage is applied between the anode 24 and the cathode 21 by the first power supply 40. By the electric field generated by the voltage applied by the second power supply 41, the CBM in the cathode 21 and the first insulating layer 31 can be inclined, and electrons can be accelerated from the cathode 21 to be allowed to transmit through the first insulating layer 31. The thickness of the metal layer 32 is preferably from 1 nm to 10 nm. This allows electrons to be more efficiently supplied from the cathode 21 to the light-emitting layer 22 via, for example, the functional layered body 30.

Figure 2:
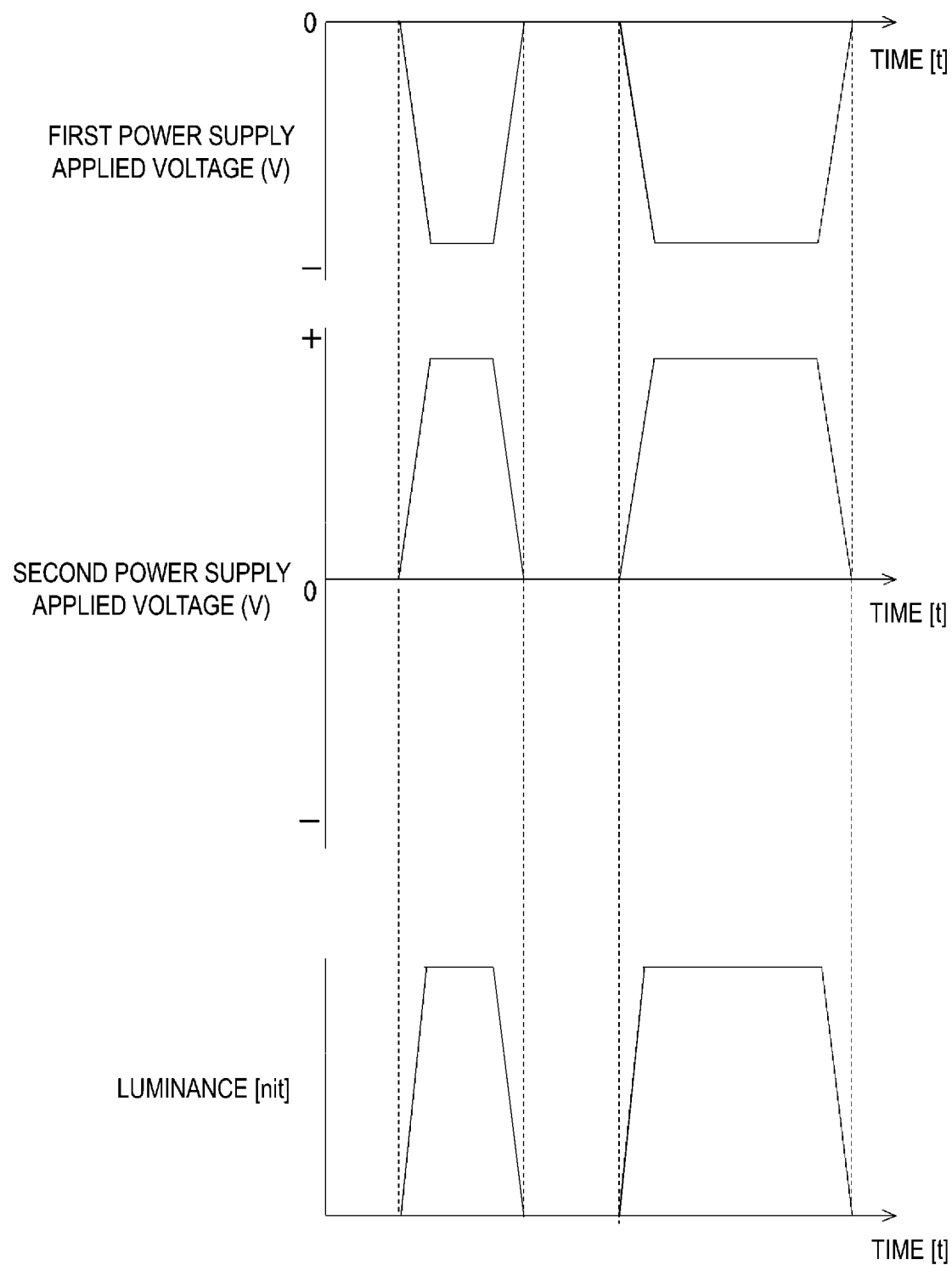
FIG. 2 is a timing chart illustrating an example of a method for controlling a first power supply and second power supply of the light-emitting device according to the first embodiment.
Figure 3:
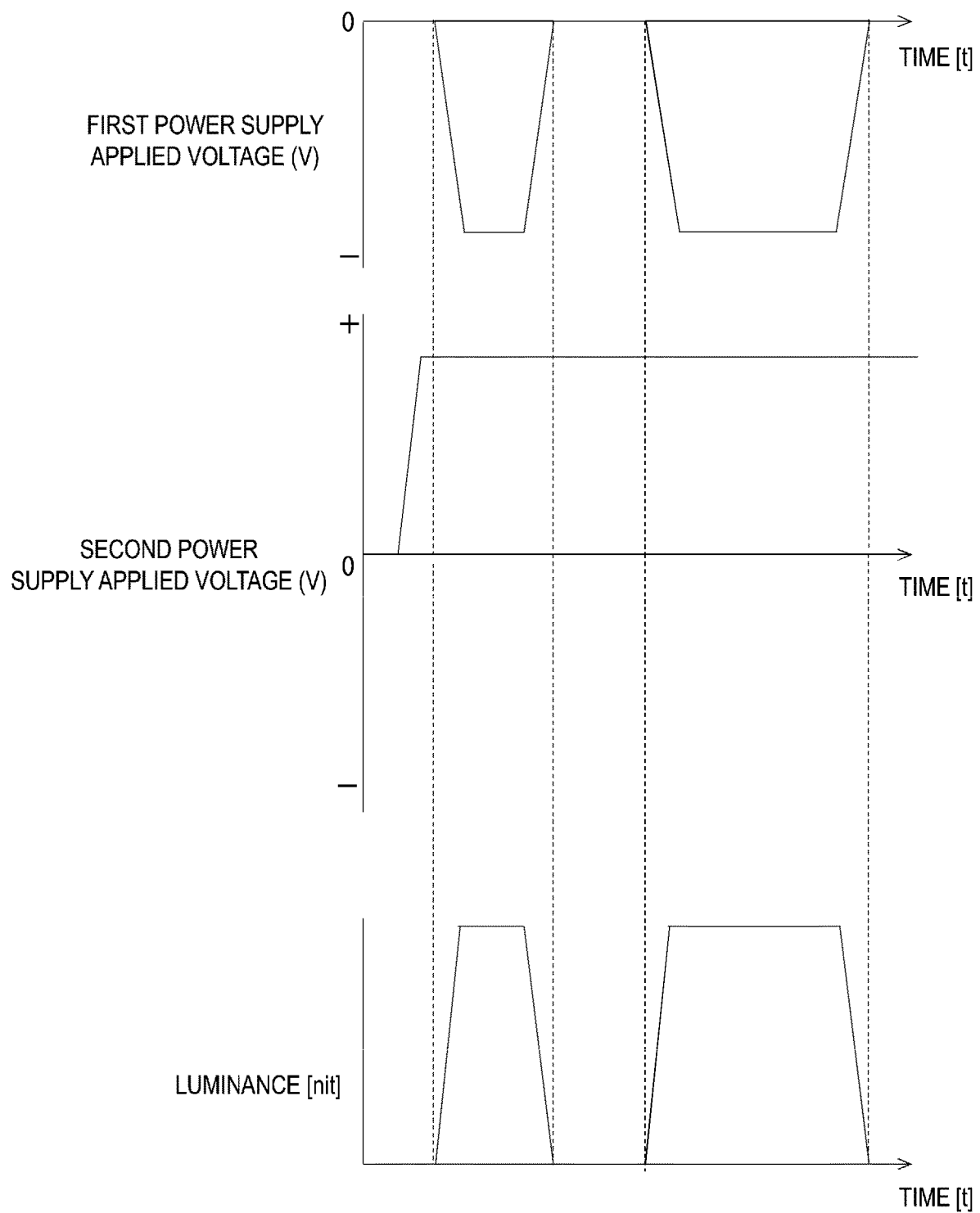
FIG. 3 is a timing chart illustrating an example of a method for controlling a first power supply and second power supply of the light-emitting device according to the first embodiment.
Figure 4:
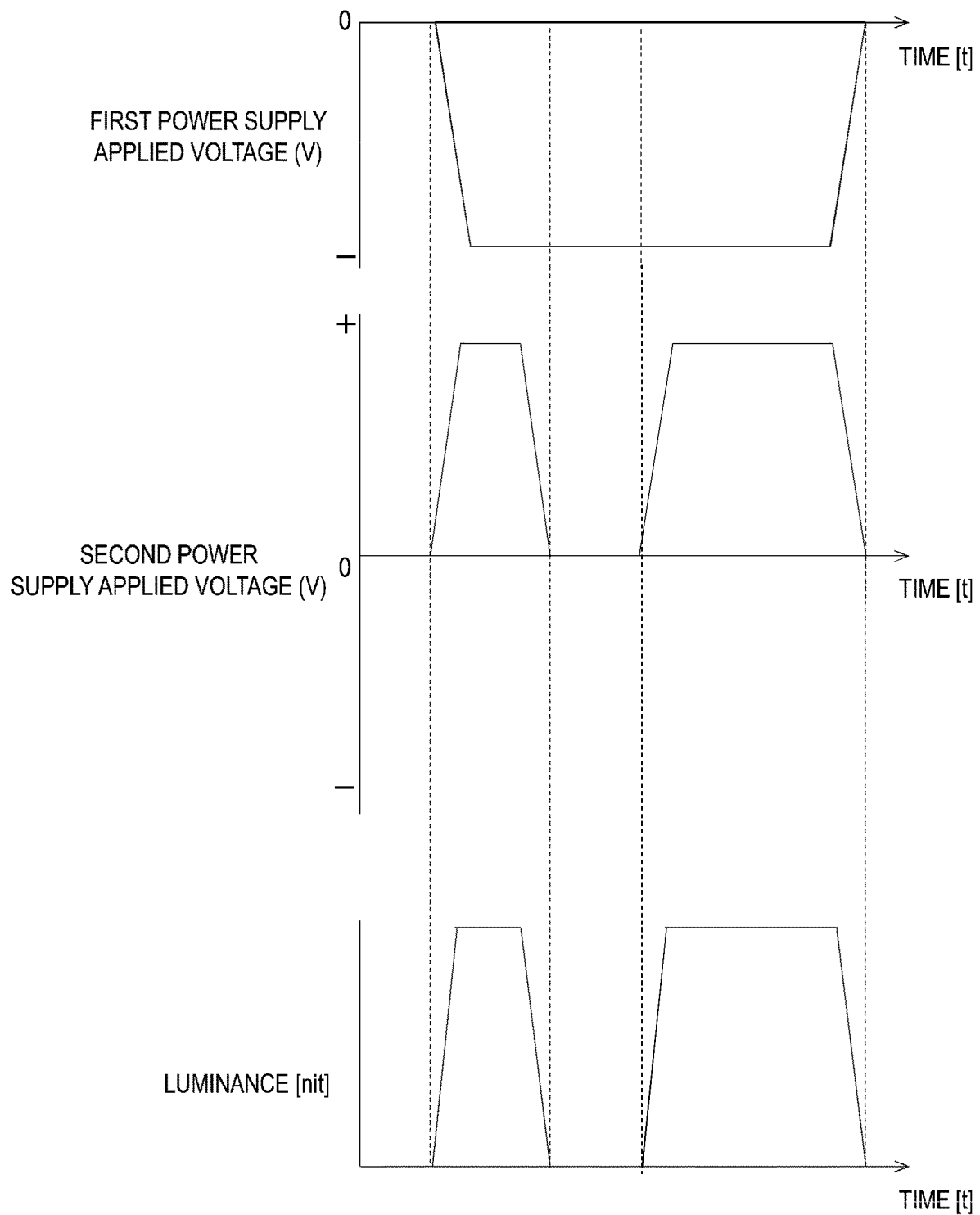
FIG. 4 is a timing chart illustrating an example of a method for controlling a first power supply and second power supply of the light-emitting device according to the first embodiment.

Each of FIGS. 2, 3, and 4 illustrates an example of a method for controlling the first power supply 40 and the second power supply 41. Each of positive and negative signs of a first power supply applied voltage and a second power supply applied voltage illustrated in FIGS. 2, 3, and 4 indicates the polarity of the cathode 21.

As illustrated in FIG. 2, the method for controlling the light-emitting device 1 preferably controls, for example, such that a period when the first power supply 40 applies, between the anode 24 and the cathode 21, a voltage for allowing the cathode 21 to be negative and a period when the second power supply 41 applies, between the metal layer 32 and the cathode 21, a voltage for allowing the cathode 21 to be positive are synchronized with each other. This makes it possible to more reliably inject electrons from the cathode 21 to the light-emitting layer 22. Additionally, in a case where the method for controlling the light-emitting device 1 illustrated in FIG. 2 is used, the metal layer 32 and the drain electrode 15 of the TFT 10 is preferably connected to each other. In the case where the metal layer 32 and the drain electrode 15 are connected to each other, by switching by the TFT 10, ON and OFF of each of the first power supply 40 and the second power supply 41 can be synchronized, and power consumption can be reduced. Note that the period when the first power supply 40 applies, between the anode 24 and the cathode 21, the voltage for allowing the cathode 21 to be negative and the period when the second power supply 41 applies, between the metal layer 32 and the cathode 21, the voltage for allowing the cathode 21 to be positive is at least partially synchronized with each other.

Furthermore, as illustrated in FIG. 3, the method for controlling the light-emitting device 1 may control the second power supply 41 such that a voltage for allowing the cathode 21 to be positive is continuously applied between the metal layer 32 and the cathode 21. This makes it possible to ignore electrostatic capacitance between the metal layer 32 and the cathode 21, enabling high responsiveness with less delay.

Furthermore, as illustrated in FIG. 4, as the method for controlling the light-emitting device 1, the first power supply 40 may be controlled such that a voltage for allowing the cathode 21 to be negative is continuously applied between the anode 24 and the cathode 21, and the second power supply 41 may be controlled for a timing at which a voltage for allowing the cathode 21 to be positive is applied between the metal layer 32 and the cathode 21.

Furthermore, the ratio of the voltage applied by the second power supply 41 to the voltage applied by the first power supply 40 is preferably from 80 to 120, and more preferably from 90 to 110. This allows electrons to be more efficiently supplied from the cathode 21 to the light-emitting layer 22 via the functional layered body 30.

The metal layer 32 may function as a reflective layer that reflects light emitted from the light-emitting layer 22. As a result, the light-emitting device 1 functions as a so-called top-emission type light-emitting device in which light from the light-emitting layer 22 is reflected on the metal layer 32 to perform display toward the anode 24 side. In the case where the metal layer 32 functions as the reflective layer in this way, the thickness of the metal layer 32 is preferably, for example, from 1 nm to 10 nm, and more preferably from 3 nm to 10 nm. The metal layer 32 serving as the reflective layer is preferably Al from the perspective of reflectivity and the like.

The light-emitting device 1 of the present embodiment is provided with the functional layered body 30 that is a layered body including the first insulating layer 31, the metal layer 32, and the second insulating layer 33 layered from the cathode 21 side, the first power supply 40 that applies, between the anode 24 and the cathode 21, a voltage for allowing the cathode 21 to be negative, and the second power supply 41 that applies, between the metal layer 32 and the cathode 21, the voltage for allowing the cathode 21 to be positive. Electrons can be efficiently supplied from the cathode 21 to the light-emitting layer 22 via the functional layered body 30 by the voltage by the first power supply 40 and the voltage by the second power supply 41.

Figure 5:
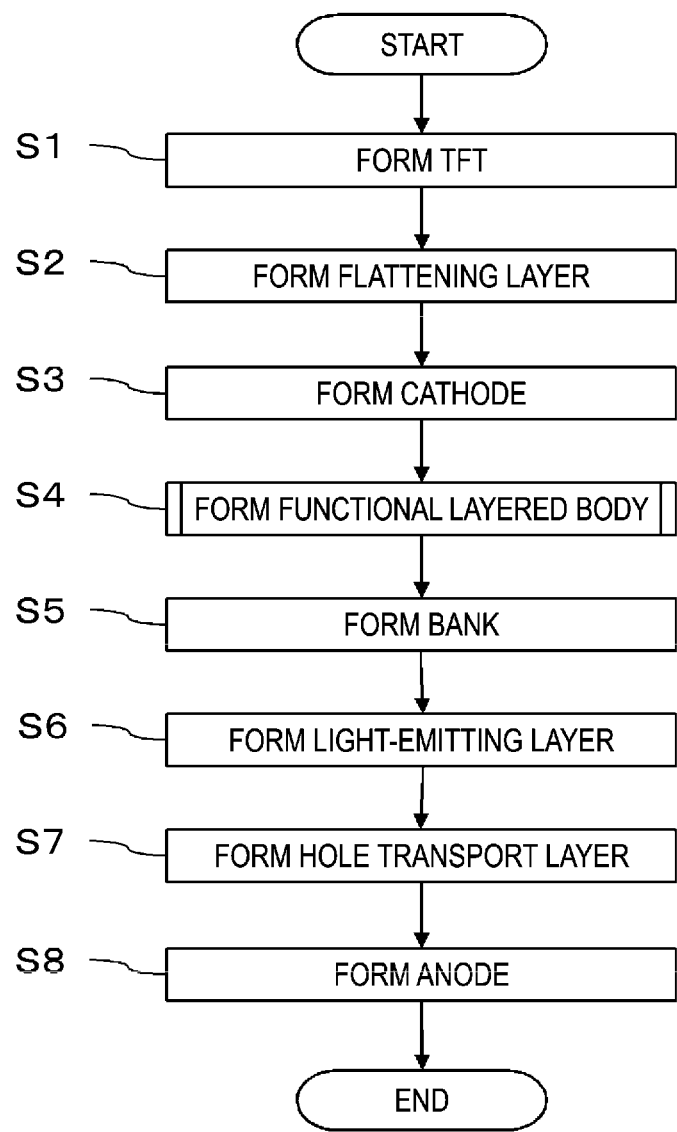
FIG. 5 is a flowchart of an example illustrating a process for manufacturing the light-emitting device according to the first embodiment.

Next, an example of a method for manufacturing the light-emitting device 1 according to the present embodiment will be described with reference to FIGS. 1 and 5.

First, the TFT 10 is formed on the substrate 2 (S1). The method for forming the TFT 10 is not particularly limited, and the TFT 10 can be manufactured by a known method, for example.

The flattening layer 16 is formed on the TFT 10 in such a manner that the surface thereof becomes flat (S2). The flattening layer 16 can be formed by applying, on the TFT 10, a solution in which an insulating material such as polyimide is dissolved, and baking, for example.

The cathode 21 is formed on the flattening layer 16 (S3). The cathode 21 is formed by a sputtering method, for example. The cathode 21 is patterned into a predetermined shape, for example.

More specifically, for example, a first mask is formed in which a portion corresponding to the drain electrode 15 on the flattening layer 16 is open. Then, the flattening layer 16 in the opening portion of the first mask is removed by asking via the first mask to form a contact hole portion from which the drain electrode 15 is exposed. Thereafter, the first mask is removed.

Furthermore, a second mask covering a portion on the flattening layer 16, in which a cathode is not formed, is formed to form a layer of a material forming the cathode 21. Then, the second mask is removed and at the same time a portion corresponding to the second mask is removed, thereby forming the cathode 21 having a predetermined shape. Consequently, the cathode 21 and the drain electrode 15 are electrically connected to each other via the contact hole portion. Further, the cathode 21 and the channel layer 13 are also electrically connected to each other via the drain electrode 15.

The functional layered body 30 is formed on the cathode 21 (S4). The case where the functional layered body 30 is formed will be more specifically described with reference to FIG. 6.

Figure 6:
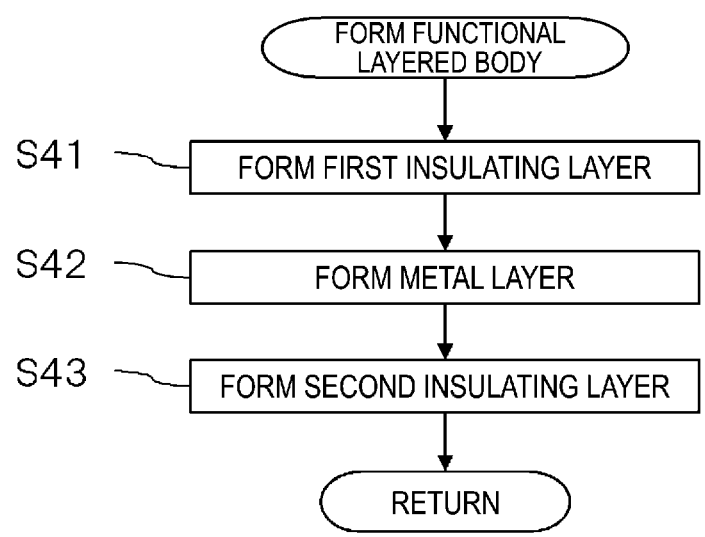
FIG. 6 is a flowchart of an example illustrating a process for manufacturing a functional layered body in FIG. 1.

For example, as illustrated in FIG. 6, the insulating layer 34 is formed on the cathode 21 (S41). The insulating layer 34 can be formed by applying, on the TFT 10, a solution in which an insulating material such as polyimide is dissolved, and baking, for example.

A third mask in which a portion corresponding to the cathode 21 on the insulating layer 34 is open is formed. Then, the insulating layer 34 of an opening portion of the third mask is removed by asking via the third mask, and an opening portion from which the cathode 21 is exposed is formed.

The first insulating layer 31 is formed on the cathode 21 of the opening portion (S41). The first insulating layer 31 can be formed by applying a solution in which an insulating material such as $Al_2O_3$ is dissolved, and baking, for example.

The metal layer 32 is formed on the first insulating layer 31 of the opening portion (S42). The metal layer 32 can be formed by a sputtering method, for example.

The second insulating layer 33 is formed on the metal layer 32 of the opening portion (S43). The second insulating layer 33 can be formed by applying a solution in which an insulating material such as $Al_2O_3$ is dissolved, and baking, for example.

Then, the third mask is removed. As described above, the functional layered body 30 embedded in the insulating layer 34 is formed.

The bank 25 is formed on the functional layered body 30 (S5). The bank 25 can be formed by a method similar to that for the flattening layer 16, for example. More specifically, for example, an insulating material is applied on the cathode 21 and baked to form a layer made of the insulating material. Then, a fourth mask in which a portion corresponding to the cathode 21 is open is formed on the layer made of the insulating material. Then, the bank 25 having an opening portion from which the cathode 21 is exposed is formed by ashing via the fourth mask. Thereafter, the fourth mask is removed.

The light-emitting layer 22 is formed on the cathode 21 exposed at the opening portion of the bank 25 (S6). That is, the light-emitting layer 22 patterned into a predetermined shape in line with the opening portion of the bank 25 is formed. The light-emitting layer 22 can be formed by various methods such as vapor deposition of a light-emitting material, such as a phosphor via a mask, and application by inkjet to the opening portion of the bank 25.

The hole transport layer 23 is formed on the light-emitting layer 22 formed in the opening portion of the bank 25 (S7). That is, the hole transport layer 23 patterned into a predetermined shape in line with the opening portion of the bank 25 is formed. The hole transport layer 23 can be formed by various methods such as vapor deposition of a light-emitting material such as a phosphor via a mask, and application by inkjet to the opening portion of the bank 25.

The anode 24 is formed on the bank 25 and the hole transport layer 23 (S8). The anode 24 can be formed by a sputtering method, for example. Note that the anode 24 may be formed on the hole transport layer 23 over the entire surface of the substrate 2, for example.

In addition, after the anode 24 is formed, a sealing layer may be formed to seal the light-emitting device 1.

In this manner, the light-emitting device 1 according to the present embodiment can be manufactured. According to the method described above, after the cathode 21 is formed, the bank 25, the light-emitting layer 22, and the like are formed. In the present embodiment, the cathode 21 is formed of, for example, an oxide semiconductor material, and thus is resistant to the environment during formation of the bank 25, the light-emitting layer 22, and the like. As such, it is possible to suppress deterioration of the luminous efficiency and the like in a case where the cathode 21 is used in the light-emitting device 1. On the other hand, for example, in a case where a metal material such as Mg or Al is used for a cathode, the cathode may deteriorate by oxidation or the like in the environment at the time of forming the bank 25, the light-emitting layer 22, and the like, and the luminous efficiency and the like may deteriorate when the cathode is used in the light-emitting device 1.

Although in the embodiment described above, the case has been described in which the first electrode is the anode and the second electrode is the cathode, the first electrode may be the cathode and the second electrode may be the anode in another embodiment. In the case of this another embodiment, the first power supply applies, between the first electrode and the second electrode, a voltage for allowing the polarity of the second electrode to be positive, and the second power supply applies, between the metal layer and the second electrode, a voltage for allowing the polarity of the second electrode to be negative. Thus, the functional layered body efficiently performs positive hole (charge) injection from the anode, which is the second electrode, to the light-emitting layer.

Second Embodiment

Figure 7:
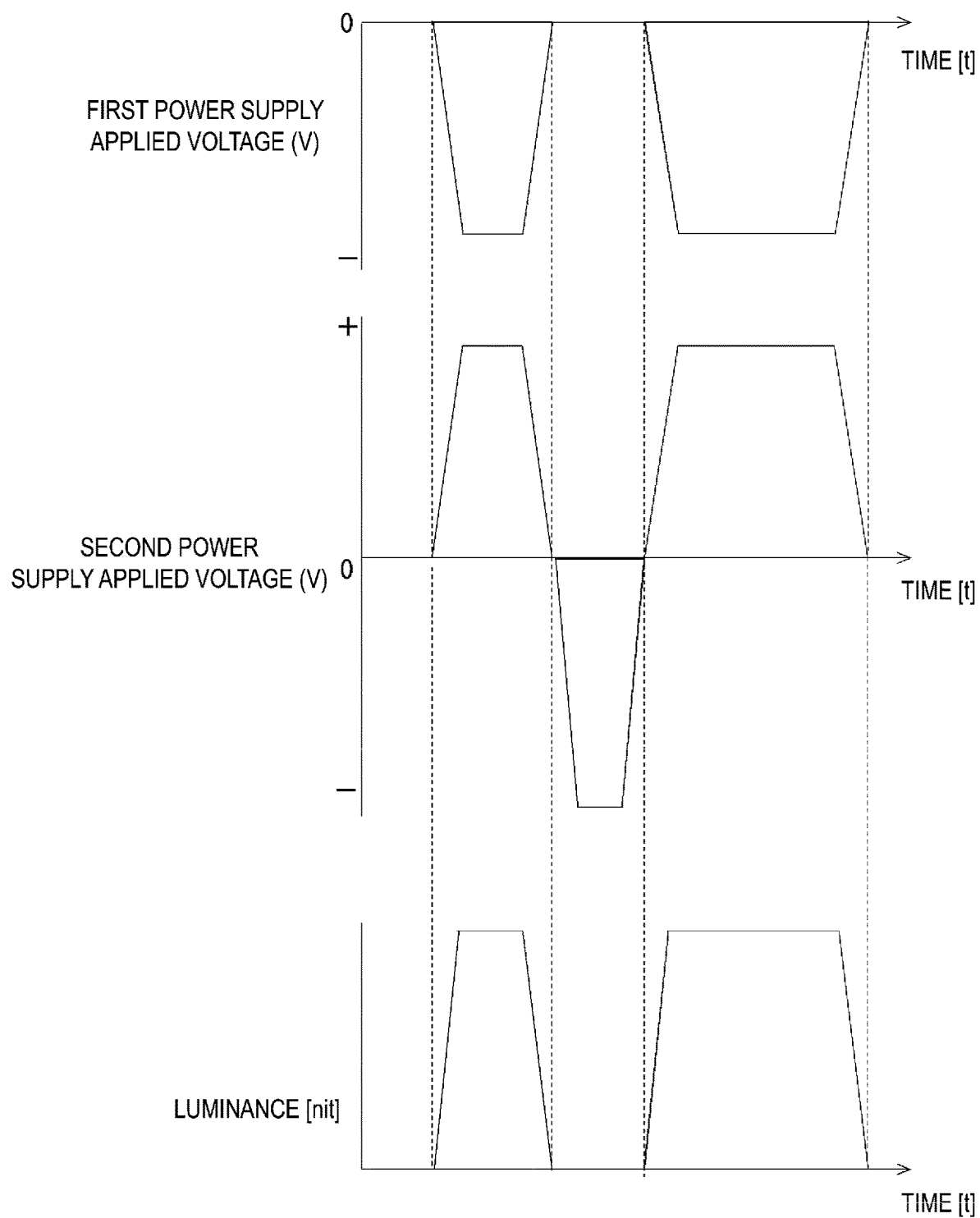
FIG. 7 is a timing chart illustrating an example of a method for controlling a first power supply and a second power supply of the light-emitting device according to a second embodiment.
Figure 8:
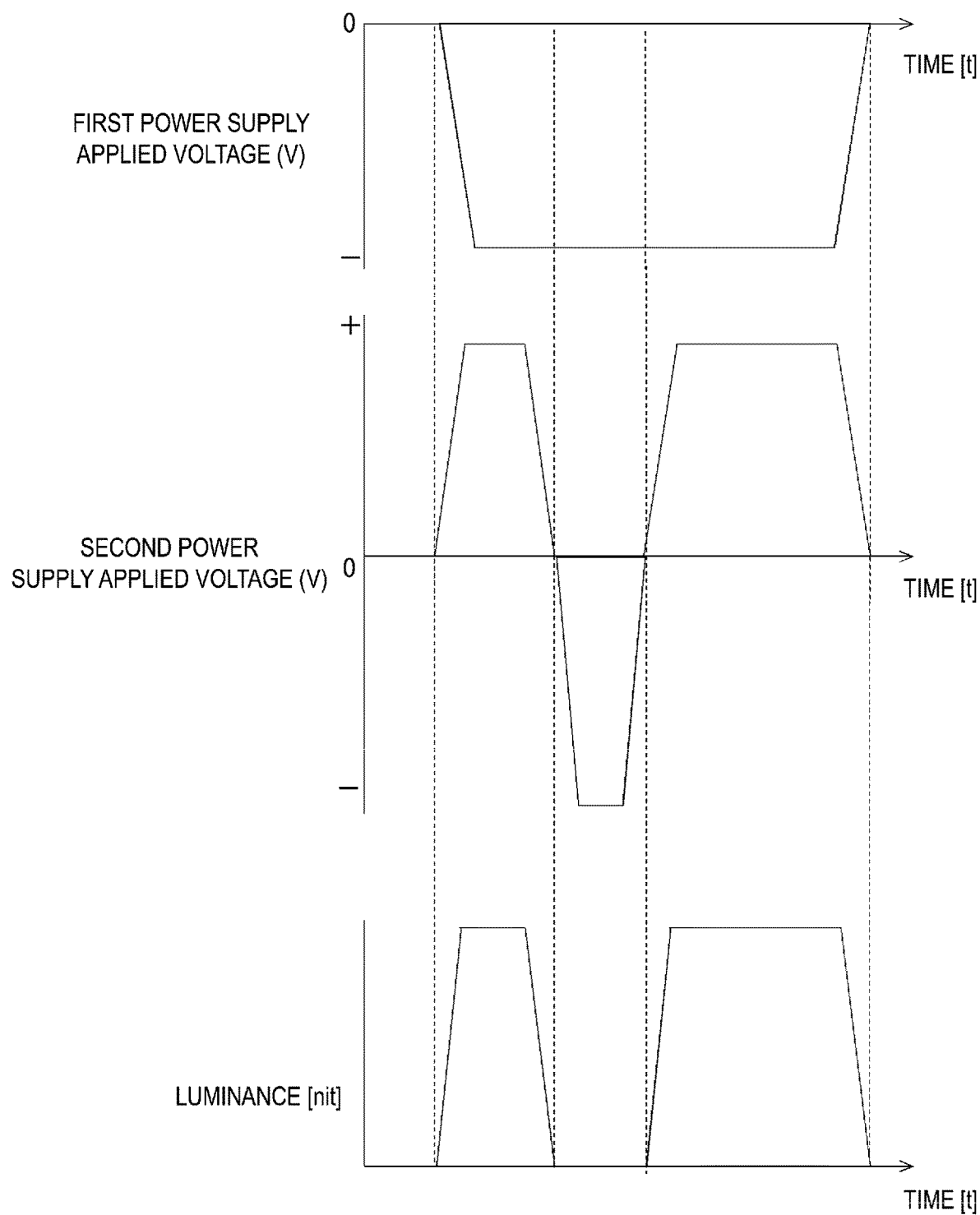
FIG. 8 is a timing chart illustrating an example of a method for controlling the first power supply and the second power supply of the light-emitting device according to the second embodiment.

Hereinafter, an embodiment of the disclosure will be described. In the first embodiment, the second power supply 41 is a DC power supply, but in the second embodiment, the second power supply 41 is an AC power supply. Other configurations are the same as those in the first embodiment, and thus a detailed description thereof will be omitted. FIGS. 7 and 8 illustrate examples of a method for controlling the first power supply 40 and the second power supply in the second embodiment. Each of positive and negative signs of the first power supply applied voltage and the second power supply applied voltage illustrated in FIGS. 7, and 8 indicates the polarity of the second electrode.

As illustrated in FIG. 7, in the light-emitting device 1 of the second embodiment, as the second power supply is the AC power supply, during a period when the first power supply does not apply a voltage between the first electrode and the second electrode, the second power supply may apply, between the metal layer and the second electrode, a voltage for allowing the polarity of the second electrode to be the same as the polarity of the second electrode when the voltage is applied between the first electrode and the second electrode by the first power supply. When the light-emitting device 1 is turned off, the polarity of the voltage applied by the second power supply 41 is inverted to apply the voltage for allowing the cathode 23 to be positive, and thus excess charge stored in the cathode 21 or the light-emitting layer 22 can be released. This makes it possible to ignore electrostatic capacitance between the metal layer 32 and the cathode 21, enabling high responsiveness with less delay.

Further, as illustrated in FIG. 8, as the second power supply is the AC power supply, luminance of the light-emitting device 1 of the second embodiment may be controlled when the first power supply continuously applies a voltage between the first electrode and the second electrode, and the second power supply applies, between the metal layer and the second electrode, a voltage for allowing the polarity of the second electrode to be the same as the polarity of the second electrode when the first power supply applies the voltage between the first electrode and the second electrode.

The second power supply 41 is driven by inverting the polarity of the applied voltage. When the light-emitting device 1 is turned off, the polarity of the voltage applied by the second power supply 41 is inverted to apply the voltage for allowing the cathode 23 to be positive, and thus excess charge stored in the cathode 21 or the light-emitting layer 22 can be released.

The disclosure is not limited to the embodiments described above, and may be substituted with a configuration that is substantially the same as the configuration described in the embodiments described above, a configuration that achieves the same action and effect, or a configuration capable of achieving the same object.

The invention claimed is:

1. A light-emitting device comprising:
a first electrode;
a second electrode facing the first electrode;
a light-emitting layer provided between the first electrode and the second electrode, and including a phosphor;
a layered body including a metal layer, a first insulating layer provided on a second electrode side of the metal layer, and a second insulating layer provided on a light-emitting layer side of the metal layer, and having a thickness allowing electron injection from the second electrode to the light-emitting layer;
a first power supply configured to apply a voltage between the first electrode and the second electrode; and
a second power supply configured to apply, between the metal layer and the second electrode, a voltage having a polarity, of the second electrode, being opposite to a polarity of the second electrode of the voltage applied between the first electrode and the second electrode by the first power supply.

2. The light-emitting device according to claim 1, wherein the first electrode is an anode,
the second electrode is a cathode,
the first power supply applies a voltage to cause the second electrode to be negative, and
the second power supply applies a voltage to cause the second electrode to be positive.

3. The light-emitting device according to claim 1, wherein the first electrode is a cathode,
the second electrode is an anode,
the first power supply applies a voltage to cause the second electrode to be positive, and
the second power supply applies a voltage to cause the second electrode to be negative.

4. The light-emitting device according to claim 1, wherein a thickness of the layered body is 20 nm or less.

5. The light-emitting device according to claim 4, wherein a thickness of the metal layer is 10 nm or less.

6. The light-emitting device according to claim 1, wherein a thickness of the first insulating layer is 5 nm or less.

7. The light-emitting device according to claim 1, wherein a thickness of the second insulating layer is 5 nm or less.

8. The light-emitting device according to claim 1, wherein the layered body promotes electron injection from the second electrode to the light-emitting layer.

9. The light-emitting device according to claim 1, wherein a ratio of a voltage applied between the second electrode and the first electrode by the first power supply to a voltage applied by the second power supply is from 80 to 120.

10. The light-emitting device according to claim 1, wherein the metal layer reflects light from the light-emitting layer.

11. The light-emitting device according to claim 1, wherein the second insulating layer is directly connected to the light-emitting layer.

12. The light-emitting device according to claim 1, further comprising:
a thin film transistor,
wherein the second electrode is connected to a drain electrode of the thin film transistor,
the first electrode is connected to a source electrode of the thin film transistor, and
the second power supply is connected to the drain electrode or the source electrode.

13. The light-emitting device according to claim 12, wherein the second power supply is connected to the drain electrode.

14. The light-emitting device according to claim 1, wherein the second electrode is made of an n-type semiconductor.

15. A method for controlling the light-emitting device according to claim 1, the method comprising
synchronizing a period when the first power supply applies, between the first electrode and the second electrode, a voltage causing the second electrode to be negative and a period when the second power supply applies, between the metal layer and the second electrode, a voltage having a polarity, of the second electrode, being opposite to a polarity of the second electrode of a voltage applied between the first electrode and the second electrode by the first power supply.

16. A method for controlling the light-emitting device according to claim 1,
wherein the second power supply applies, between the metal layer and the second electrode, a voltage having a polarity, of the second electrode, being opposite to a polarity of the second electrode of a voltage applied between the first electrode and the second electrode by the first power supply, in a period when the first power supply applies a voltage between the first electrode and the second electrode and a period when the first power supply does not apply a voltage between the first electrode and the second electrode.

17. A method for controlling the light-emitting device according to claim 1,
wherein the second power supply is an AC power supply, and
the second power supply applies, between the metal layer and the second electrode, a voltage having a polarity, of the second electrode, being same as a polarity of the second electrode of the voltage applied between the first electrode and the second electrode by the first power supply, during a period when the first power supply does not apply a voltage between the first electrode and the second electrode.

\* \* \* \* \*